(12) United States Patent
Yan et al.

(10) Patent No.: US 10,298,179 B2
(45) Date of Patent: May 21, 2019

(54) AMPLIFIER ARRANGEMENT AND AMPLIFICATION METHOD

(71) Applicant: ams AG, Unterpremstaetten (AT)

(72) Inventors: Weixun Yan, Schwerzenbach (CH); Thomas Froehlich, Ottikon (CH)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/310,084

(22) PCT Filed: Mar. 24, 2015

(86) PCT No.: PCT/EP2015/056273
§ 371 (c)(1),
(2) Date: Nov. 9, 2016

(87) PCT Pub. No.: WO2015/172925
PCT Pub. Date: Nov. 19, 2015

(65) Prior Publication Data
US 2017/0155365 A1    Jun. 1, 2017

(30) Foreign Application Priority Data

May 12, 2014  (EP) .................................... 14167868

(51) Int. Cl.
*H03F 3/04*        (2006.01)
*H03F 1/26*        (2006.01)
(Continued)

(52) U.S. Cl.
CPC .............. *H03F 1/26* (2013.01); *H03F 3/185* (2013.01); *H04R 19/005* (2013.01); *H04R 19/04* (2013.01);
(Continued)

(58) Field of Classification Search
CPC ...... H03F 1/26; H03F 3/185; H03F 2200/153; H03F 2200/03; H03F 2200/471; H04R 19/005; H04R 19/04; H04R 2201/003
(Continued)

(56) References Cited

U.S. PATENT DOCUMENTS 4,286,492 A    9/1981   Claret
5,012,134 A    4/1991   Kimura
(Continued)

FOREIGN PATENT DOCUMENTS

EP    2648333 A2    10/2013
GB    2158315 A     11/1985
(Continued)

OTHER PUBLICATIONS

Hogervorst, R. et al., "A Compact Power-Efficient 3 V CMOS Rail-to-Rail Input/Output Operational Amplifier for VLSI Cell Libraries", IEEE Journal of Solid-State Circuits, vol. 29, No. 12, 1994, pp. 1505-1513.
(Continued)

*Primary Examiner* — Khanh V Nguyen
*Assistant Examiner* — Khiem Nguyen
(74) *Attorney, Agent, or Firm* — McDermott Will & Emery LLP

(57) ABSTRACT

An amplifier arrangement has an input transistor being connected between reference potential terminals by a current source and a current sink. An amplifier stage has an amplifier output coupled to a first connection node between the current sink and a first terminal of the input transistor by means of a feedback path, and an amplifier input connected to a second connection node between the current source and the second terminal of the input transistor. A level-shifting structure has a level-shifting element with one end connected to a reference connection, wherein the level-shifting (Continued)

element is adapted to perform a level-shifting of a potential at the second connection node with respect to a potential at the reference connection. The reference connection is coupled to one of the following: the amplifier output, the first connection node, a control terminal of the input transistor.

18 Claims, 5 Drawing Sheets

(51) Int. Cl.
*H03F 3/185* (2006.01)
*H04R 19/04* (2006.01)
*H04R 19/00* (2006.01)

(52) U.S. Cl.
CPC .... *H03F 2200/03* (2013.01); *H03F 2200/153* (2013.01); *H03F 2200/471* (2013.01); *H04R 2201/003* (2013.01)

(58) Field of Classification Search
USPC .......................................... 330/296, 85, 277
See application file for complete search history.

(56) References Cited

U.S. PATENT DOCUMENTS

| | | |
|---|---|---|
| 7,787,642 B2 | 8/2010 | Baker et al. |
| 7,791,411 B2 | 9/2010 | Frohlich et al. |
| 2003/0042975 A1 | 3/2003 | Gower et al. |
| 2007/0103207 A1 | 5/2007 | Huang |
| 2014/0104000 A1* | 4/2014 | Gerstenhaber ........ H03F 1/3211 330/257 |

FOREIGN PATENT DOCUMENTS

| | | |
|---|---|---|
| WO | 9832222 A1 | 7/1998 |
| WO | 02097975 A2 | 12/2002 |

OTHER PUBLICATIONS

Duisters, T. et al, "A 90-dB THD Rail-to-Rail Input Opamp Using a New Local Charge Pump in CMOS", IEEE Journal of Solid-State Circuits, vol. 33, No. 7, 1998, pp. 947-955.

* cited by examiner

AMPLIFIER ARRANGEMENT AND AMPLIFICATION METHOD

BACKGROUND OF THE INVENTION

The present disclosure relates to an amplifier arrangement and to an amplification method to be performed with an amplifier arrangement.

Amplifiers are widely used in electronic circuits. In various applications amplifier arrangements may be used for amplifying microphone signals, in particular from microelectromechanical systems, MEMS, microphones.

In some amplifier implementations super source follower stages may be used, which buffer an input voltage signal. In such implementations, an input transistor is connected between supply terminals by means of respective current sources. One terminal of the input transistor is connected to a further amplifier stage that compares the resulting signal to a reference voltage. A further terminal of the input transistor is connected to an output of the amplifier arrangement by a feedback path.

With such a conventional solution clipping may occur during large signal operation, i.e. large amplitudes at an input terminal of the input transistor. A good noise performance is further hard to achieve with the conventional solutions.

SUMMARY OF THE INVENTION

The present disclosure provides an improved amplification concept that can be used more reliably also for large signal operations.

An amplifier arrangement according to the improved amplification concept comprises an input transistor with a first terminal coupled to a first reference potential terminal by means of a current sink, with a second terminal coupled to a second reference potential terminal by means of a current source, and with a control terminal connected to a signal input. Such an amplifier arrangement further comprises an amplifier stage with an amplifier output coupled to a first connection node between the current sink and the first terminal of the input transistor by means of a feedback path, and with an amplifier input connected to a second connection node between the current source and the second terminal of the input transistor. For example, the input transistor is a field effect transistor, its first terminal being a source connection and its second terminal being a drain connection. Consequently, the control terminal is a gate connection.

The improved amplification concept is based on the idea that a potential at the second connection node is controlled depending on a voltage level at the signal input. To this end, a level-shifting structure is included in the improved amplification concept that comprises a level-shifting element with one end connected to a reference connection that follows the input signal. The level-shifting element is further applied such that it is adapted to perform a level-shifting of a potential at the second connection node with respect to a potential at the reference connection. For example, the reference connection may be coupled to the amplifier output, to the first connection node or to the control terminal of the input transistor, which more or less all follow the voltage level of the input signal.

The level-shifting at the second connection node has the effect that for small input signals the potential at the second connection node is low with respect to a supply potential at the second reference potential terminal. Hence, there is a higher voltage drop across the current source. Under such circumstances, a good noise performance of the amplifier arrangement can be achieved, in particular with respect to power supply rejection ratio, PSRR. In this respect, lower input voltages are defined as being low in relation to a supply voltage. Similarly, higher input voltages are in the range of the supply voltage itself.

If such higher input voltages occur, the voltage drop across the current source is reduced. This also means that the current between the first and the second terminal of the input transistor is reduced, which possibly results in a noise degradation. Nevertheless, the overall performance metric for large signals, which is measured as a ratio between signal to noise and distortion is improved compared to conventional solutions.

Hence, according to the improved amplification concept, a dynamic trade-off between a low noise operation at small input signals and a low distortion operation at large input signals is made. By controlling the potential at the second connection node between the current source and the second terminal of the input transistor, also the voltage drop across the current source is controlled dynamically. As a consequence, a voltage difference between a first and a second terminal of the input transistor can be controlled to be basically always at or above a certain minimum level, which may be a saturation voltage plus some safety margin of, for example, 100 mV.

Hence, an amplifier arrangement according to the improved concept comprises the level-shifting structure described above. Similarly, an amplification method according to the improved concept is performed with an amplifier arrangement comprising the input transistor connected between the current source and the current sink, and the amplifier stage as described above.

According to an embodiment of the amplification method, a level-shifting of a potential at the second connection node is performed with respect to a potential at the reference connection as described above.

In various implementations the level-shifting structure is adapted to limit the potential at the second connection node to a predefined voltage level below a potential at the second reference potential terminal. The same applies to the performing of the level-shifting in the corresponding amplification method. With such a limitation it can be achieved that a voltage drop over the current source is present regardless of a voltage level of the input signal. This serves, for example, the purpose of avoiding unwanted conditions of the amplifier arrangement, during which both the first and the second connection node tend to a positive supply voltage. Under such conditions it may be possible that the arrangement becomes stuck in an unwanted state due to the feedback path. It should, however, be noted that the limiting is not necessary for all cases, in particular not for cases where an input signal amplitude may be limited.

In some implementations the level-shifting structure comprises a further level-shifting element with one end connected to the first reference potential terminal. The further level-shifting element is adapted to perform a level-shifting of the potential at the second connection node with respect to a potential at the first reference potential terminal, which is preferably a fixed potential that does not float with the input signal. The level-shifting structure further comprises a comparison unit that is adapted to activate either of the level-shifting element and the further level-shifting element for performing the level-shifting at the second connection node. A decision on which one of the level-shifting element and the further level-shifting element is activated is based on an evaluation of the potential at the reference connection and/or the first connection node.

Hence, either a level-shifting based on a floating level or a level-shifting based on a fixed level can be performed. This can, for example, be used for delimiting of the potential at the second connection node as described above.

According to one implementation with the comparison unit, the comparison unit is adapted to activate one of the level-shifting element and the further level-shifting element for performing the level-shifting at the second connection node depending on a comparison of the potential at the reference connection with a threshold voltage.

For example, the comparison unit is adapted to activate the level-shifting element for performing a level-shifting at the second connection node if the potential at the reference connection is lower than a threshold voltage, and to activate the further level-shifting element for performing the level-shifting at the second connection node if the potential at the reference connection is higher than the threshold voltage. In other words, the decision on which level-shifting element to activate is based on an evaluation of a potential at the floating reference connection, limiting the voltage at the second connection node.

In a further example, the comparison unit is adapted to activate the level-shifting element for performing a level-shifting at the second connection node if the potential at the reference connection is higher than a threshold voltage, and to activate the further level-shifting element for performing the level-shifting at the second connection node if the potential at the reference connection is lower than the threshold voltage. This implementation allows the amplifier stage to have an input stage which is not rail to rail type.

In an alternative implementation the comparison unit is adapted to activate the level-shifting element for performing a level-shifting at the second connection node if a potential at the control terminal is higher than the potential at the first connection node, and to activate the further level-shifting element for performing the level-shifting at the second connection node if the potential at the control terminal is lower than the potential at the first connection node. Hence, in this implementation the potential at the control terminal of the input transistor is evaluated with respect to a potential at the first connection node. During operation of the amplifier arrangement, if the voltage at the first terminal of the input transistor, for example a source terminal, approaches the control potential of the input transistor, this means that the input transistor leaves the normal conducting operation range. The comparison unit detects such a condition and effects the level-shifting based on a fixed reference potential that is sufficiently below a supply voltage at the second reference potential terminal.

Only for the sake of completeness, in the implementations with a comparison unit, preferably only one of the level-shifters is activated while the other one is deactivated and does not actually perform level-shifting. Hence, it may be switched between the two level-shifters depending on the comparison result.

In various implementations the amplifier stage is implemented as a differential amplifier or an operational amplifier. In this case the amplifier input may be an inverting input of the amplifier stage. The amplifier stage may then further comprises a non-inverting input. The level-shifting element has the one end connected to the reference connection and the second end coupled to the non-inverting input. Hence, there is a fixed level-shifting between the reference connection and the non-inverting input. If, for example, the reference connection is coupled to the first connection node, the level-shifting element determines a voltage between the first and the second terminal of the input transistor.

In alternative implementations the level-shifting element is at least partially formed of a further input transistor of the amplifier stage. For example, a threshold voltage of one of the transistors of a transistor stage of the amplifier stage implements the level-shifting if, for example, the control terminal of said transistor is connected to the reference connection.

In various implementations of the amplifier arrangement according to the improved concept, the amplifier stage is implemented with a positive input offset such that an output potential at the amplifier output assumes a potential at the first reference potential terminal in case a voltage difference between the amplifier input and the further amplifier input is zero. Hence, a predefined output, in particular with a low output potential, can be generated even in the case of the positive supply voltage being present at the amplifier input and the further amplifier input.

In some implementations of the amplifier arrangement according to the improved concept, a monitor circuit is foreseen that is configured to detect a condition where both a potential at the first connection node and the potential at the second connection node converge to a potential at the second reference potential terminal, and to reset the amplifier stage in response to such detection. Also with such implementations unwanted operating conditions can be avoided.

In various implementations using a field effect transistor for the input transistor, the input transistor may be chosen as an n-channel field effect transistor. However, also a p-channel field effect transistor can be used in alternative implementations, wherein the circuit is flipped in this case with respect to the polarity of the supply provided at the first and the second reference potential terminal. Such modifications become apparent for the skilled person.

Although the improved amplification concept was described with reference to different implementations of the amplifier arrangement, corresponding implementations for the amplification method become easily apparent from the above description. This particularly pertains to the selective performance of a level-shifting with respect to one of two base potentials, the one being a floating potential and the other one being a fixed potential.

The improved amplification concept may advantageously used in conjunction with capacitive MEMS microphones providing the input voltage to be amplified.

BRIEF DESCRIPTION OF THE DRAWINGS

The following description of figures of exemplary embodiments may further illustrate and explain the invention. Devices and circuit blocks with the same structure and the same effect, respectively, are denoted with the same reference signs. In so far as circuit blocks or devices correspond to one another in terms of their function in different figures, the description thereof is not repeated for each of the following figures.

In the drawings.

DETAILED DESCRIPTION

Figure 1:
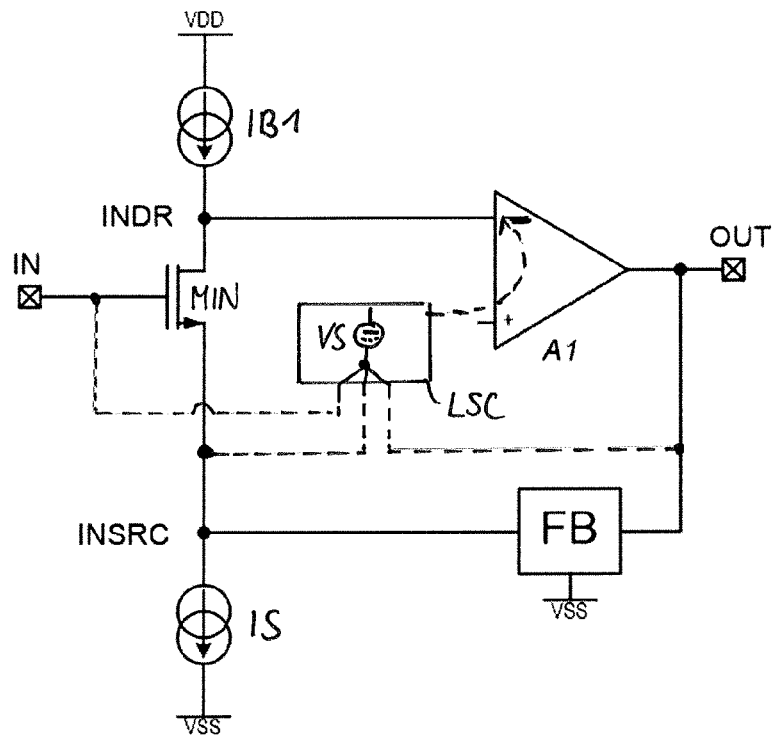
FIG. 1 shows an embodiment of an amplifier arrangement.

FIG. 1 shows an embodiment of an amplifier arrangement according to the improved amplification concept, which may be regarded as a basic implementation for the improved concept and the further embodiments described in conjunction with FIG. 2 to FIG. 8.

The amplifier arrangement comprises an input transistor MIN with a first terminal, which in this case is a source terminal, being coupled to a first reference potential terminal VSS by means of a current sink IS. A second terminal of the input transistor MIN, which in this case is a drain terminal, is coupled to a second reference potential terminal VDD by means of a current source IB1. A control terminal of the input transistor, which in this case is a gate terminal, is connected to a signal input IN. A first connection node INSRC is formed by the connection between the first terminal and the current sink IS. A second connection node INDR is formed by a connection of the second terminal and the current source IB1.

The input transistor MIN in the embodiment of FIG. 1 is chosen as an n-channel field effect transistor. However, also a p-channel field effect transistor can be used in alternative implementations, wherein the circuit is flipped in this case with respect to the polarity of the supply provided at the first and the second reference potential terminal VSS, VDD. Such modifications become apparent for the skilled person.

The amplifier arrangement further comprises an amplifier stage A1 with a first input coupled to the second connection node INDR. The first amplifier input may be a non-inverting input in this case. The amplifier stage A1 comprises an amplifier output OUT that is coupled to the first connection node INSRC by means of a feedback path FB.

According to the improved amplification concept, the amplifier arrangement further comprises a level-shifting structure LSC, which operates over a second amplifier input, in particular a non-inverting input, to the first amplifier input or to the second connection node INDR, respectively. The operation of the level-shifting structure LSC is hence designated with a dashed line that indicates several possibilities for operation, as described in more detail in conjunction with FIGS. 3 to 8. The level-shifting structure LSC comprises a level-shifting element VS with one end connected to a reference connection that is coupled to one of three possible nodes.

According to a first option, the reference connection is connected to the amplifier output OUT. According to a second option, the reference connection is coupled to the first connection node INSRC, and according to a third option, the reference connection is coupled to the control terminal of the input transistor MIN or the signal input IN, respectively. The dashed lines showing these connections express that only one of these optional connections is present in each case.

The level-shifting element VS is adapted to perform a level-shifting of a potential at the second connection node INDR with respect to a potential at the reference connection.

All of the three nodes, to which the reference connection can be coupled, have in common that their voltage level follows a level of an input signal provided at the signal input IN. Hence, the potential at the second connection node INDR is shifted by a certain amount with respect to a potentially changing voltage level at the reference connection.

The implementation of the amplifier arrangement according to the improved amplification concept uses a source follower concept generally known in the art. The feedback path FB provides a feedback loop that may be used to set a certain gain or frequency response of the amplifier arrangement. Despite such amplification gain or frequency response, an output signal at the amplifier output OUT represents a buffered version of the input signal. However, according to the improved concept, a voltage at the second connection node INDR is controlled based on a voltage following a voltage level of an input signal.

According to the improved amplification concept, the employment of the level-shifting structure effects that the drain voltage of the input transistor MIN, i.e. the voltage at the second connection node INDR is controlled and therefore also the voltage drop across the current source IB1 is controlled dynamically. Hence, a voltage difference between drain and source of the input transistor MIN is always at or above a certain predefined minimum voltage. For example, such a predefined minimum voltage is defined as a saturation voltage of the transistor plus a safety margin of, for example, 100 mV.

According to the implementation shown in FIG. 1, the level-shifting structure LSC represents a mechanism which makes the second connection node INDR dynamically trace the voltage on the first connectin node INSRC or any of its following nets such as the signal input node IN, with a monotonically increasing behavior, which is not necessarily linear. With this mechanism the drain-to-source voltage of the input transistor MIN can be biased with very small headroom during the normal operation, and all the voltage headroom can be used for the current source IB1 to enhance the PSRR and noise performance. The level-shifting element VS may be a voltage source, whose voltage may be chosen arbitrarily, as long as a reasonable DC biasing for the amplifier can be established.

The current source IB1 and the current sink IS may be implemented as a controlled field effect transistor or a defined resistor or other implementations of current sources or current sinks known in the art.

Figure 2:
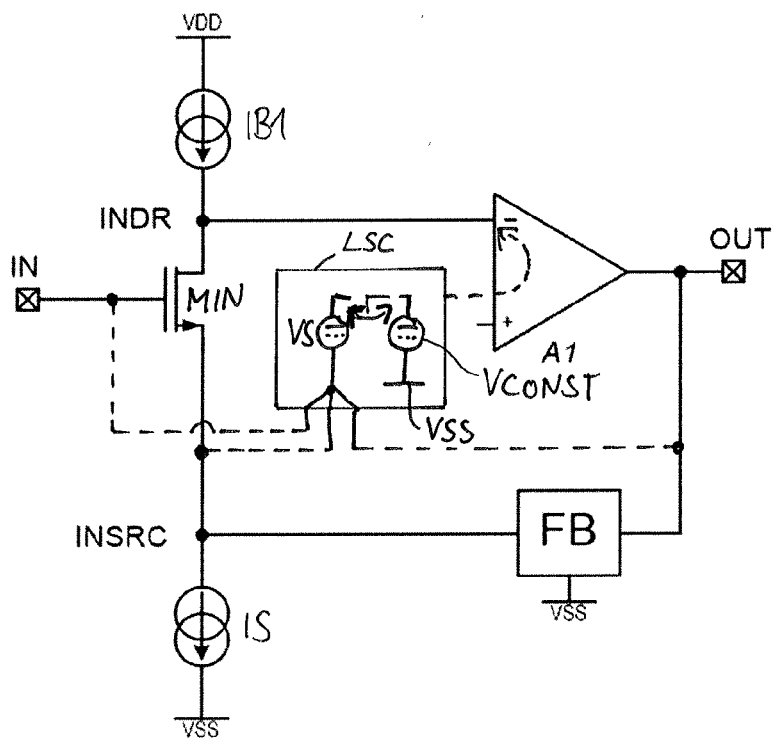
FIG. 2 shows a further embodiment of an amplifier arrangement.

FIG. 2 shows a further embodiment of an amplifier arrangement according to the improved amplification concept. In particular, FIG. 2 shows a development of the embodiment of FIG. 1. Hence, the differences to the previous embodiment will be mainly described in the following.

In FIG. 2 the level-shifting structure LSC, further to the level-shifting element VS, comprises a further level-shifting element VCONST that is connected to the first reference potential terminal VSS with one end. A switching element or multiplexer is included in the level-shifting structure LSC which is adapted to connect either the level-shifting element VS or the further level-shifting element VCONST such that the level-shifting of the potential at the second connection node INDR can be performed. The switching preferably is controlled by a comparison unit (not shown) that evaluates the potential at the reference connection or a potential derived from said potential.

For example, the comparison unit compares a potential resulting from the potential at the reference connection plus the level-shifting contributed by the level-shifting element VS with the potential generated by the further level-shifting element VCONST. In other words, the potentials at the upper ends of the level-shifters VS, VCONST, both connected to the switch, may be compared.

For example, the larger potential of the two is used for the actual level-shifting such that only one of the level-shifting elements VS, VCONST is activated while the other one is deactivated. Hence, the voltage at the second connection node INDR is set either to a voltage which is a certain level, defined by the level-shifting element VS, above the reference connection potential, or to a constant voltage defined by the further level-shifting element VCONST, whichever is higher. Such an implementation allows, for example, the amplifier stage A1 to be of a non-rail-to-rail type.

In a different approach the implementation of FIG. 2 can also be used to limit the potential at the connection node INDR. In such an implementation the further level-shifting element VCONST generates a voltage level which is a predefined voltage level below a potential at the second reference potential terminal VDD. In this case the comparison described before is performed such that not the larger resulting voltage level, but the smaller resulting voltage level, is used for the level-shifting. Hence, for small input voltages, the potential at the second connection node INDR follows the potential at the reference connection. for larger input signals in the range near the supply potential at the second reference potential terminal VDD a safety margin is kept such that the voltage drop across the current source IB1 does not become zero.

Figure 3:
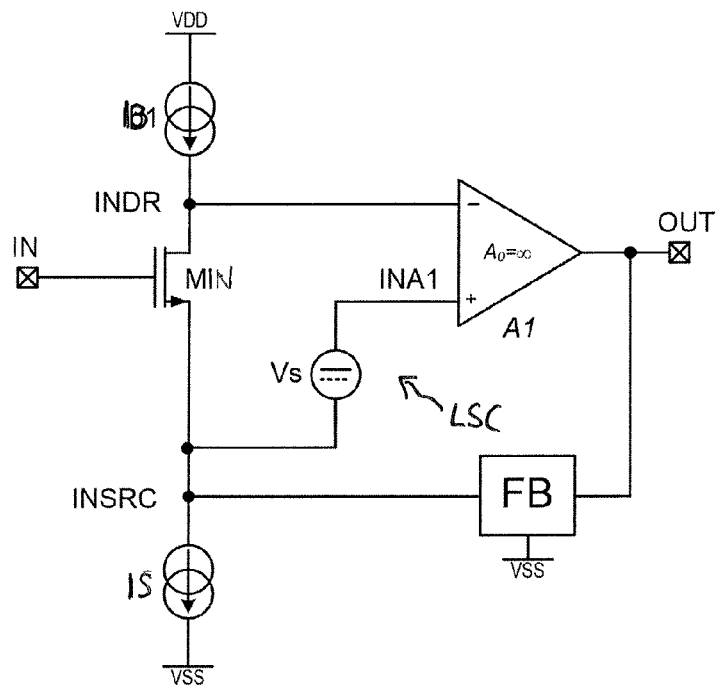
FIG. 3 shows a further embodiment of an amplifier arrangement.

FIG. 3 shows a further implementation of the improved amplification concept, which is based on the embodiment of FIG. 1. In this embodiment the level-shifting element VS is connected to the first connection node INSRC at its first end. Thus, the first connection node INSRC is the reference connection in the specific implementation, which of course can be altered as described for FIG. 1. The second end of the level-shifting element VS is connected to the second amplifier input. Hence, the voltage drop across the input transistor MIN is controlled to be equal to the level-shifting voltage of the level-shifting element VS.

Figure 4:
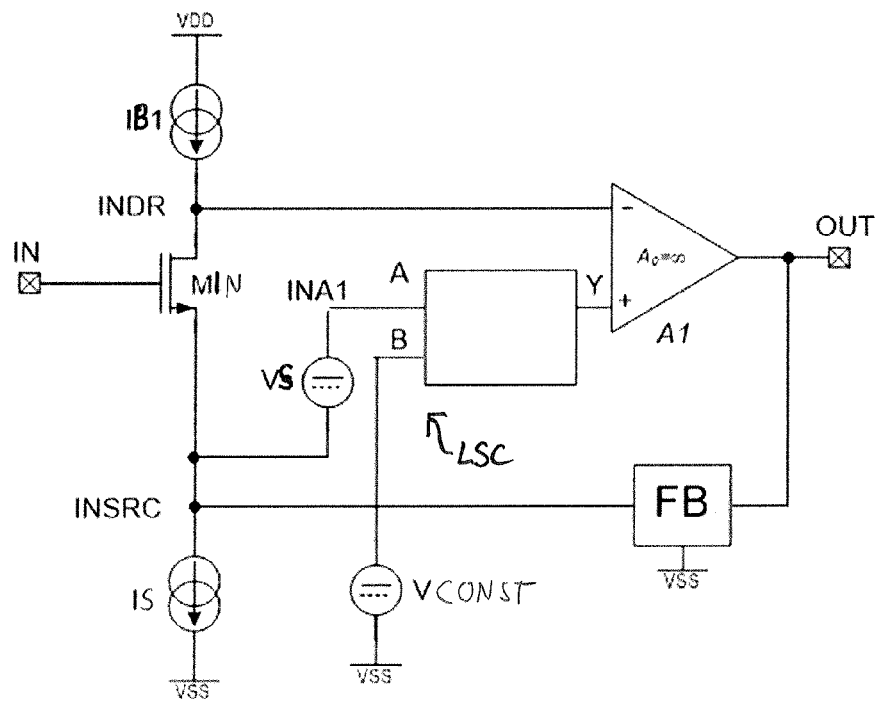
FIG. 4 shows a further embodiment of an amplifier arrangement.

FIG. 4 shows a further example implementation according to the improved amplification concept that is based on the embodiments described in the previous figures, in particular with respect to FIG. 2.

Similar to the implementation of FIG. 3, the level-shifting element VS has its one end connected to the first connection node INSRC. The second end of the level-shifting element VS is connected to an input A of a control block, while a further input B of the control block is connected to the further level-shifting element VCONST. An output Y of the block is connected to the second input of the amplifier stage A1. As described above for the embodiment of FIG. 2, the control block compares the voltage levels at the inputs A, B and provides one of the input voltages to its output Y or the second amplifier input, respectively. To this end, the control block may include the above-mentioned comparison unit and respective switches or a multiplexer. It may be expedient if an input voltage is limited not to exceed or even be close to the positive supply voltage at VDD in order to have the amplifier arrangement according to the improved amplification concept in a safe and controlled operating state.

If this cannot be guaranteed by external measures, it may be advantageous to implement one or measures to counteract an unwanted state of the amplifier arrangement.

For example, a maximum voltage which is generated by the level-shifting element VS or that is present at the second connection node INDR can be limited to a voltage smaller than the positive supply voltage at VDD.

In a different approach for avoiding an unwanted state, for example both input terminals of the amplifier stage being at the positive supply voltage, a positive input offset in the amplifier stage A1 can be implemented. Hence an output voltage of the amplifier stage A1 goes to the reference supply voltage at VSS when the input terminals of the amplifier stage A1 are at the same potential.

A further approach is to implement a DC voltage feedback in the feedback path FB which ensures that the first connection node INSRC, or in general the reference connection, is always at least the voltage level of the level-shifting element VS plus some safety margin below the positive supply voltage at VDD.

In a further implementation, a monitor circuit can be provided that detects the undesired operating state and resets the amplifier upon detection.

In another implementation a circuit is implemented which monitors the operation point of the input transistor MIN and resets the amplifier if the input transistor MIN gets out of its normal operation point.

Figure 5:
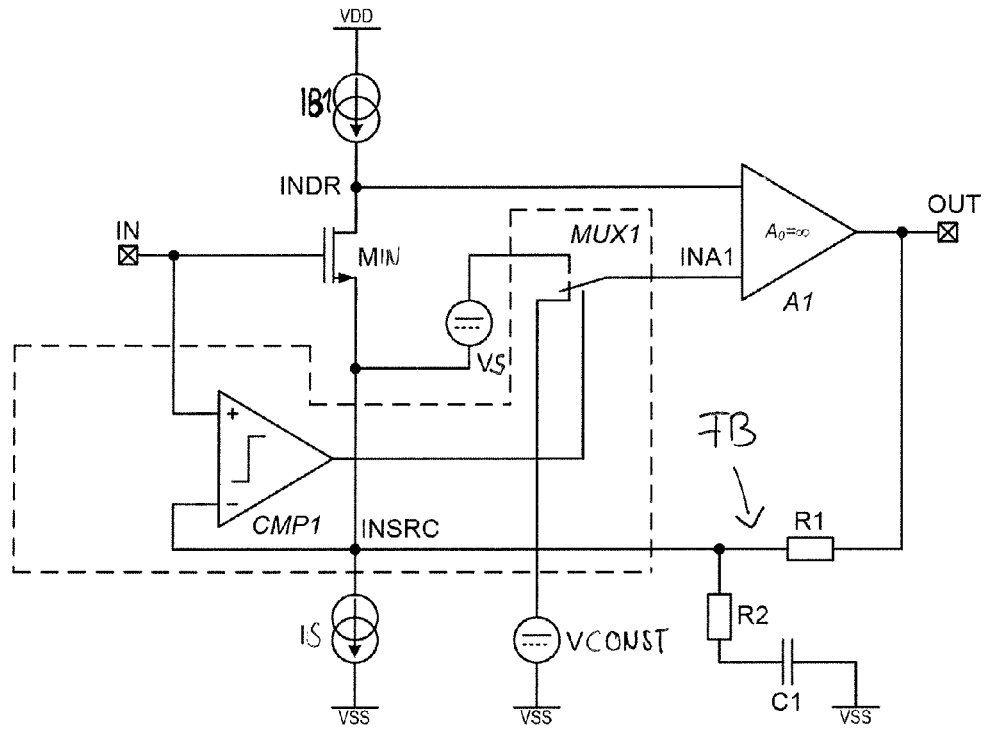
FIG. 5 shows a further embodiment of an amplifier arrangement.

For example, a solution which implements the dynamic drain voltage regulation at the second connection node INDR and a monitor circuit for avoiding unwanted operating states, is shown in FIG. 5.

The operation point of the circuit is monitored by a comparator CMP1 which compares the gate voltage of the input transistor MIN with the potential at the first connection node INSRC and controls a switching between the level-shifting element VS and the further level-shifting element VCONST by means of a multiplexer switch MUX1. If the source voltage of the input transistor MIN approaches the gate potential this means that the input transistor MIN leaves the normal conducting operation range. In this case, the comparator CMP1 connects the second input of the amplifier stage A1 to the fixed level-shifting element VCONST having a potential that is sufficiently below the positive supply voltage at VDD. The regulation loop then avoids the unwanted operating state.

It should be noted that the feedback path FB comprises resistors R1, R2 and a capacitor C1 for setting a gain and frequency response of the feedback loop. Such implementation can also be used with the other embodiments.

Figure 6:
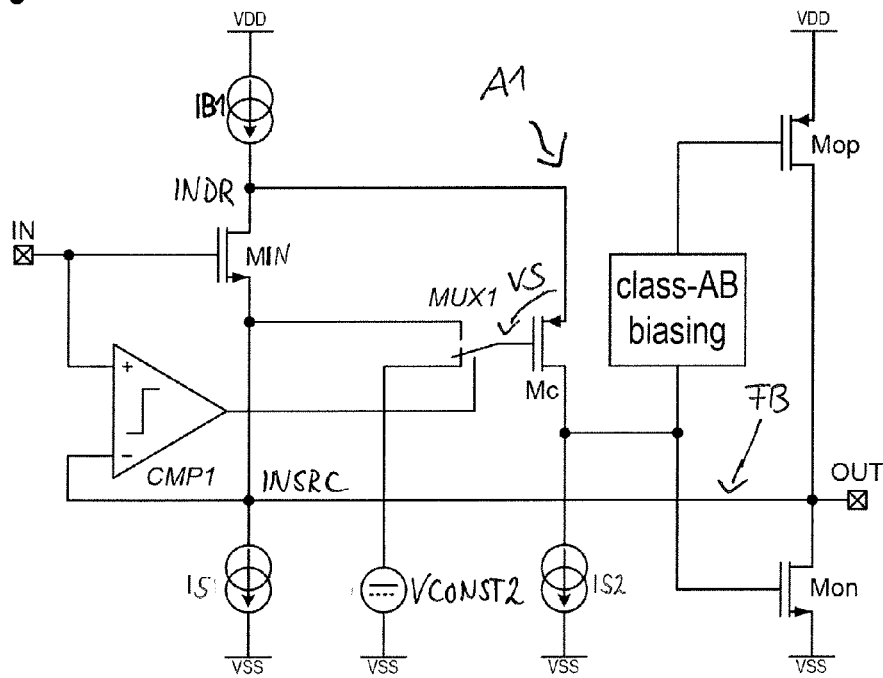
FIG. 6 shows a further embodiment of an amplifier arrangement.

FIG. 6 shows a further implementation that is based on the embodiment of FIG. 1 and is further similar to the embodiment of FIG. 5. In this implementation the amplifier stage A1 is implemented as a high gain stage with a folded cascade stage MC together with a class AB output stage with transistors Mop and Mon. The input signal tracing mechanism is realized by biasing the folded cascade transistor MC with the source node of MIN or the first connection node INSRC, respectively. The drain-to-source headroom of the input transistor MIN is therefore defined by the threshold voltage of the transistor MC. In other words, the level-shifting element VS is implemented with the transistor MC in this implementation.

As described before for FIG. 5, the potentials at the input node IN and the output node OUT, namely through the direct feedback FB, are compared to check if there is any current flowing through the input transistor MIN. The result of the comparison performed by the comparator CMP1 is used to control the multiplexer MUX1, in order to define the DC operating point for ensuring a safe operation of the circuit.

Figure 7:
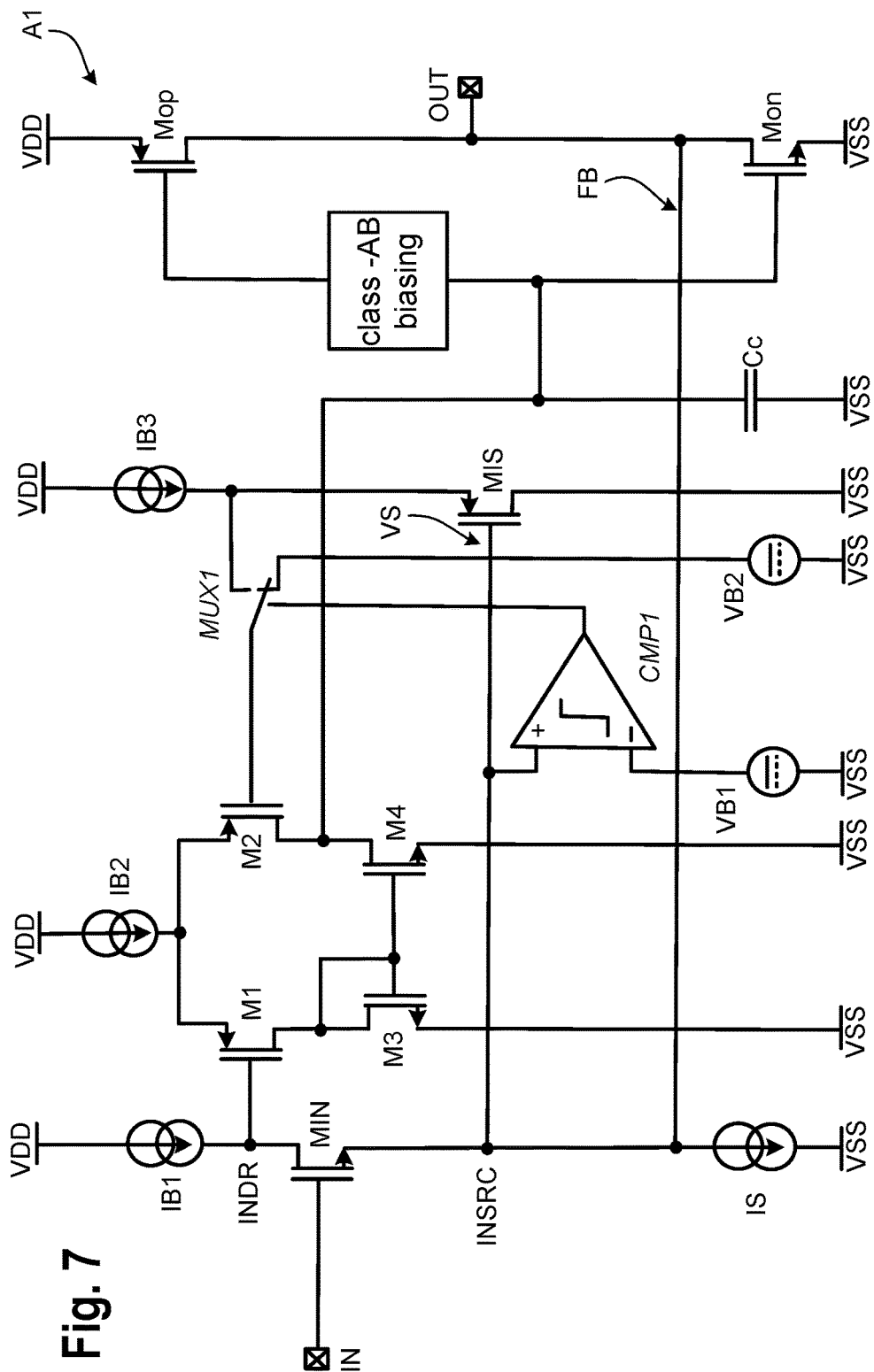
FIG. 7 shows a further embodiment of an amplifier arrangement.

FIG. 7 shows a further example of an amplifier arrangement according to the improved amplification concept based on the previously described embodiments, at least the embodiment of FIG. 1.

The amplification stage A1 in FIG. 7 is implemented with a differential amplifier comprising transistors M1, M2, M3, M4 together with a class AB output stage with transistors Mop, Mon. The level-shifting element is implemented with the transistor MIS, whose threshold voltage acts as a level-shifter connecting the first connection node INSRC as the reference connection to the second amplifier input at transistor M2 via the multiplexer MUX1. The first amplifier input is at the transistor M1. The transistor MIS, together with the current source IB3 connecting the transistor MIS to the second reference potential terminal VDD implements a source follower stage and realizes a floating voltage source for providing the level-shifting. With reference to FIG. 2 and FIG. 4, the comparator CMP1 and the multiplexer MUX1 evaluate the voltage level at the reference connection or the first connection node INSRC by a comparison with a threshold voltage VB1. For a large signal input, the voltage level on the second connection node INDR or the drain node of the input transistor MIN has a bottom limit set by a voltage provided by the level-shifting element VB2, therefore a minimum voltage headroom for the input transistor MIN is guaranteed.

Figure 8:
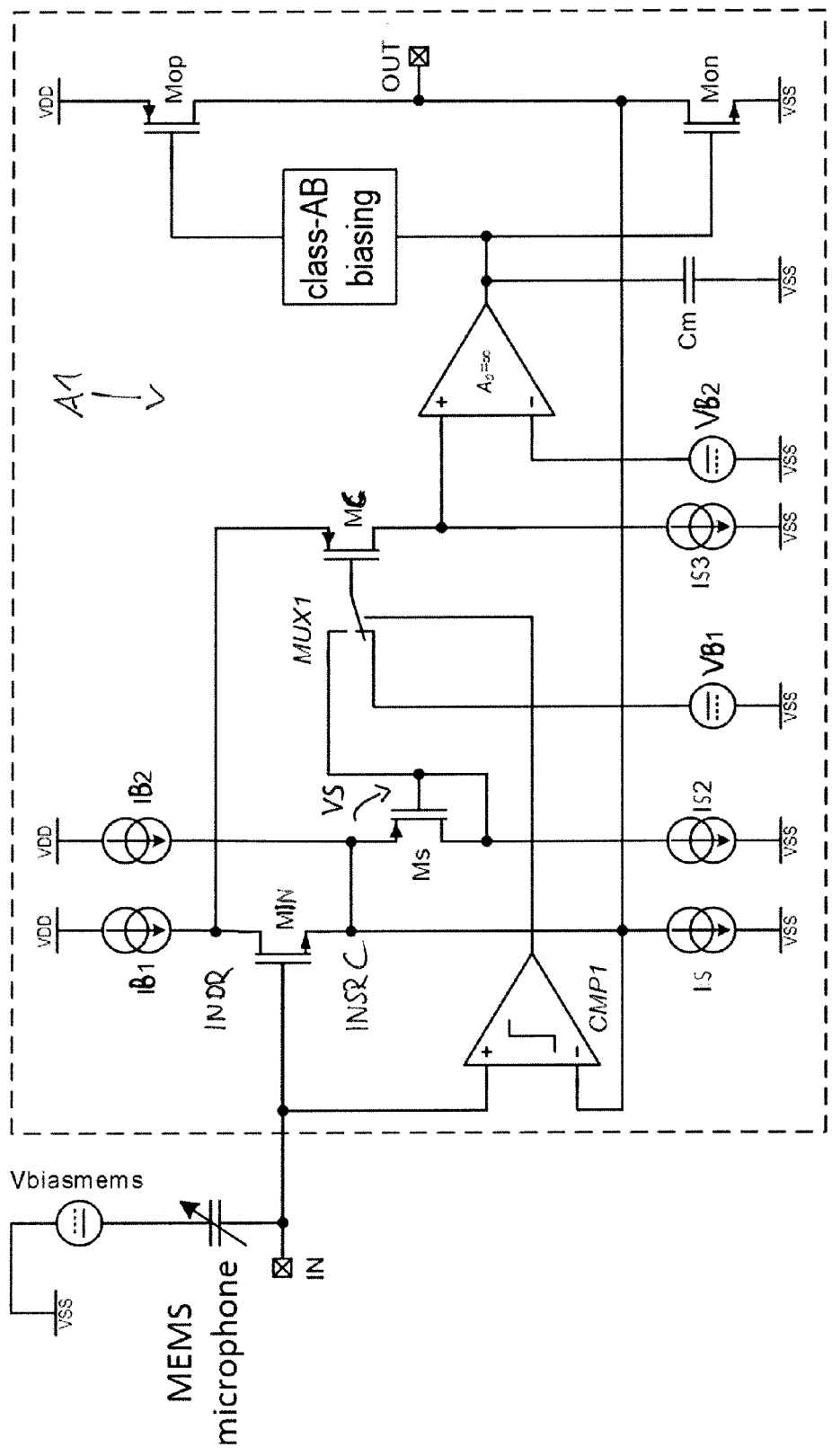
FIG. 8 shows a further embodiment of an amplifier arrangement in conjunction with a MEMS microphone connected to the signal input.

FIG. 8 shows a further implementation of an amplifier arrangement according to the improved amplification concept, which has a capacitive MEMS microphone connected at the input IN. The MEMS microphone is biased by a voltage source VBIASMEMS.

Here, the transistor MS represents the level-shifting element VS for performing a level-shifting with respect to the first connection node INSRC as the reference connection. The inputs of the amplifier stage A1 are realized as the gate and source connections of the transistor MC, whose drain terminal is connected to an amplifying element. The output of the amplifying element is connected to a class AB output stage with transistors Mop, Mon, as previously described. As described before, for example for FIGS. 5 and 6, the comparator CMP1 compares the voltage at the input terminal IN with the voltage at the reference connection, which here is the first connection node INSRC. The comparator CMP1 controls the multiplexer MUX1 for either providing the voltage of the transistor MS or of the voltage source VB1 to the gate of the transistor MC.

In the described configuration, the transistor MC is always biased in triode region, such that the transistor MC behaves like a voltage-controlled resistor. For a small signal operation the output resistance value of the transistor MC is small enough, so the drain node of the input transistor MIN, respectively the second connection node INDR, is biased at the voltage of the voltage source VB2. Therefore, more freedom can be obtained to define the drain source voltage of the input transistor MIN to save headroom, for example compared to the embodiment of FIG. 6.

For a large signal operation, when the voltage at the amplifier output OUT goes high, the resistance value of the transistor MC increases. That means that also the drain source voltage of the transistor MC increases. The current source IB1 pulls up the drain node of the input transistor MIN, in particular higher than the voltage of voltage source VB2. Therefore, the operation range of the input transistor MIN is extended.

The current mode level shifter comprises the current source IB2, the current sink IS2 and the transistor MS, which can also be added to the circuit shown in FIG. 6 in order to bias the cascade transistor MC, which is not working in the triode region but in the saturation region. To this end, also the amplifier connecting the transistor MC to the class AB output stage can be omitted such that the drain node of the cascade transistor MC is directly connected to the input of the class AB stage. Therefore, the drain source headroom of the input transistor MIN is defined by the threshold difference of the transistors MS and MC, and more freedom for choosing the drain source bias voltage for the input transistor MIN can be achieved.

In the various embodiments described above, both a good noise performance, in particular a good PSRR and a low total harmonic distortion, THD, can be achieved. With the improved amplification concept, the clipping point inside the amplifier arrangement can be removed. Furthermore, a significant voltage headroom saving for the amplifier can be provided to achieve operations with large input signals, while maintaining good noise, PSRR and THD performance for small input signals. The input characteristic is not affected either. As a result, the improved amplification concept is suitable for low noise rail-to-rail input and output applications with a high dynamic range. As shown, for example, in conjunction with FIG. 8, the improved amplification concept can be well used with microphone applications, in particular with MEMS microphones.

It should be noted that the class AB stage, used in various embodiments described above, is only used as an example. Other kinds of output stages may also be used.

The invention claimed is:

1. An amplifier arrangement comprising:
   an input transistor with a first terminal coupled to a first reference potential terminal via a current sink, with a second terminal coupled to a second reference potential terminal via a current source, and with a control terminal connected to a signal input;
   an amplifier stage with an amplifier output coupled to a first connection node between the current sink and the first terminal of the input transistor via a feedback path, and with an amplifier input connected to a second connection node between the current source and the second terminal of the input transistor; and
   a level-shifting structure comprising a level-shifting element with one end connected to a reference connection that is coupled to one of the following: the amplifier output, the first connection node, the control terminal of the input transistor,
   wherein the level-shifting element is adapted to perform a level-shifting of a potential at the second connection node with respect to a potential at the reference connection, and
   wherein the level-shifting structure comprises
      a further level-shifting element with one end connected to the first reference potential terminal, the further level-shifting element being adapted to perform a level-shifting of the potential at the second connection node with respect to a potential at the first reference potential terminal, and
      a comparison unit that is adapted to activate either of the level-shifting element and the further level-shifting element for performing the level-shifting at the second connection node based on an evaluation of the potential at the reference connection and/or the first connection node.

2. The amplifier arrangement according to claim 1, wherein the level-shifting structure is adapted to limit the potential at the second connection node to a predefined voltage level below a potential at the second reference potential terminal.

3. The amplifier arrangement according to claim 1, wherein the comparison unit is adapted to activate one of the level-shifting element and the further level-shifting element for performing the level-shifting at the second connection node depending on a comparison of the potential at the reference connection with a threshold voltage.

4. The amplifier arrangement according to claim 1, wherein the comparison unit is adapted to activate the level-shifting element for performing the level-shifting at the second connection node if a potential at the control terminal is higher than the potential at the first connection node, and to activate the further level-shifting element for performing the level-shifting at the second connection node if the potential at the control terminal is lower than the potential at the first connection node.

5. The amplifier arrangement according to claim 1, wherein the amplifier input is an inverting input of the amplifier stage,
wherein the amplifier stage further comprises a non-inverting input, and
wherein the level-shifting element has the one end connected to the reference connection and a second end coupled to the non-inverting input.

6. The amplifier arrangement according to claim 1, wherein the amplifier stage comprises an amplifier input transistor, and
wherein the level-shifting element is at least partially formed of the amplifier input transistor.

7. The amplifier arrangement according to claim 1, wherein the amplifier stage is implemented with a positive input offset such that an output potential at the amplifier output assumes a potential at the first reference potential terminal in case a voltage difference between the amplifier input and a further amplifier input is zero.

8. The amplifier arrangement according to claim 1, further comprising a monitor circuit that is configured to detect a condition where both a potential at the first connection node and the potential at the second connection node converge to a potential at the second reference potential terminal, and to reset the amplifier stage in response to such detection.

9. An amplification method to be performed with an amplifier arrangement, the amplifier arrangement comprising:
an input transistor with a first terminal coupled to a first reference potential terminal via a current sink, with a second terminal coupled to a second reference potential terminal via a current source, and with a control terminal connected to a signal input; and
an amplifier stage with an amplifier output coupled to a first connection node between the current sink and the first terminal of the input transistor by means of a feedback path, and with an amplifier input connected to a second connection node between the current source and the second terminal of the input transistor,
the amplification method comprising:
performing a level-shifting of a potential at the second connection node with respect to a potential at a reference connection that is coupled to one of the following: the amplifier output, the first connection node, the control terminal of the input transistor, and
performing a level-shifting of the potential at the second connection node with respect to selectively either the potential at the reference connection or a potential at the first reference potential terminal, based on an evaluation of the potential at the reference connection and/or the first connection node.

10. The amplification method according to claim 9, further comprising:
limiting the potential at the second connection node to a predefined voltage level below a potential at the second reference potential terminal.

11. The amplification method according to claim 9, wherein the level-shifting is performed with respect to the potential at the reference connection if the potential at the reference connection is lower than a threshold voltage, and with respect to the potential at the first reference potential terminal if the potential at the reference connection is higher than the threshold voltage.

12. The amplification method according to claim 9, wherein the level-shifting is performed with respect to the potential at the reference connection if a potential at the control terminal is higher than the potential at the first connection node, and with respect to the potential at the first reference potential terminal if the potential at the control terminal is lower than the potential at the first connection node.

13. The amplification method according to claim 9, further comprising detecting a condition where both a potential at the first connection node and the potential at the second connection node converge to a potential at the second reference potential terminal, and resetting the amplifier stage in response to such detection.

14. The amplification method according to claim 9, wherein the amplifier stage comprises an amplifier input transistor, and wherein the level-shifting is at least partially performed with the amplifier input transistor.

15. An amplification method to be performed with an amplifier arrangement, the amplifier arrangement comprising:
an input transistor with a first terminal coupled to a first reference potential terminal via a current sink, with a second terminal coupled to a second reference potential terminal via a current source, and with a control terminal connected to a signal input; and
an amplifier stage with an amplifier output coupled to a first connection node between the current sink and the first terminal of the input transistor by means of a feedback path, and with an amplifier input connected to a second connection node between the current source and the second terminal of the input transistor,
the amplification method comprising:
performing a level-shifting of a potential at the second connection node with respect to a potential at a reference connection that is coupled to one of the following: the amplifier output, the first connection node, the control terminal of the input transistor; and
detecting a condition where both a potential at the first connection node and the potential at the second connection node converge to a potential at the second reference potential terminal, and resetting the amplifier stage in response to such detection.

16. An amplifier arrangement comprising:
an input transistor with a first terminal coupled to a first reference potential terminal via a current sink, with a second terminal coupled to a second reference potential terminal via a current source, and with a control terminal connected to a signal input;
an amplifier stage with an amplifier output coupled to a first connection node between the current sink and the first terminal of the input transistor via a feedback path, and with an amplifier input connected to a second connection node between the current source and the second terminal of the input transistor; and
a level-shifting structure comprising a level-shifting element with one end connected to a reference connection that is coupled to one of the following: the amplifier output, the first connection node, the control terminal of the input transistor, wherein the level-shifting element is adapted to perform a level-shifting of a potential at the second connection node with respect to a potential at the reference connection, wherein the amplifier input is an inverting input of the amplifier stage, wherein the amplifier stage further comprises a non-inverting input, and wherein the level-shifting element has the one end connected to the reference connection and a second end coupled to the non-inverting input.

17. The amplifier arrangement according to claim 16, wherein the level-shifting structure is adapted to limit the potential at the second connection node to a predefined voltage level below a potential at the second reference potential terminal.

18. An amplifier arrangement comprising:
  an input transistor with a first terminal coupled to a first reference potential terminal via a current sink, with a second terminal coupled to a second reference potential terminal via a current source, and with a control terminal connected to a signal input;
  an amplifier stage with an amplifier output coupled to a first connection node between the current sink and the first terminal of the input transistor via a feedback path, and with an amplifier input connected to a second connection node between the current source and the second terminal of the input transistor;
  a level-shifting structure comprising a level-shifting element with one end connected to a reference connection that is coupled to one of the following: the amplifier output, the first connection node, the control terminal of the input transistor; and
  a monitor circuit that is configured to detect a condition where both a potential at the first connection node and the potential at the second connection node converge to a potential at the second reference potential terminal, and to reset the amplifier stage in response to such detection,
  wherein the level-shifting element is adapted to perform a level-shifting of the potential at the second connection node with respect to a potential at the reference connection.

* * * * *